US010082852B2

(12) United States Patent
Lin

(10) Patent No.: US 10,082,852 B2
(45) Date of Patent: Sep. 25, 2018

(54) STORAGE DEVICE AND RESET METHOD THEREOF

(71) Applicant: Silicon Motion, Inc., Jhubei, Hsinchu County (TW)

(72) Inventor: Jiyun-Wei Lin, Hsinchu (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 0 days.

(21) Appl. No.: 15/408,652

(22) Filed: Jan. 18, 2017

(65) Prior Publication Data
US 2017/0277237 A1 Sep. 28, 2017

(30) Foreign Application Priority Data

Mar. 23, 2016 (TW) .............................. 105108938 A

(51) Int. Cl.
G06F 1/20 (2006.01)
G06F 1/24 (2006.01)

(52) U.S. Cl.
CPC ...................................... G06F 1/24 (2013.01)

(58) Field of Classification Search
CPC ........................................................ G06F 1/24
See application file for complete search history.

(56) References Cited

U.S. PATENT DOCUMENTS

| 5,835,784 A | 11/1998 | Gillespie et al. |
| 5,913,045 A | 6/1999 | Gillespie et al. |
| 5,978,878 A | 11/1999 | Lange |
| 7,181,605 B2 * | 2/2007 | Bogin .................. G06F 1/24 710/267 |
| 2005/0151583 A1 * | 7/2005 | Tseng .................. H03K 3/3565 327/558 |

FOREIGN PATENT DOCUMENTS

| TW | 516034 B | 1/2003 |
| TW | 201416841 A | 5/2014 |

* cited by examiner

Primary Examiner — Edward J Dudek, Jr.
(74) Attorney, Agent, or Firm — McClure, Qualey & Rodack, LLP

(57) ABSTRACT

A storage device including a processor, a controller, and a switch is provided. The processor is configured to control a logic circuit. When a main reset signal is enabled, the processor generates a sub-reset signal according to the operation status of the logic circuit. The controller generates a mask signal according to the main reset signal and the sub-reset signal. When the mask signal is enabled, the switch does not transmit the main reset signal to the logic circuit. When the mask signal is not enabled, the switch transmits the main reset signal to the logic circuit to reset the logic circuit.

9 Claims, 4 Drawing Sheets

US 10,082,852 B2

STORAGE DEVICE AND RESET METHOD THEREOF

CROSS REFERENCE TO RELATED APPLICATIONS

This Application claims priority of Taiwan Patent Application No. 105108938, filed on Mar. 23, 2016, the entirety of which is incorporated by reference herein.

BACKGROUND OF THE INVENTION

Field of the Invention

The invention relates to a storage device, and more particularly to a storage device which is capable of resetting a logic circuit after a logic circuit integrated into the storage device is disabled.

Description of the Related Art

Generally, every electrical device comprises a reset switch to reset the operating system of the electronic device. Once an electronic device shuts down, a user can press the reset switch to power-on the electronic device so that the electronic device operates normally. However, when the storage device in the electronic device is performing a write operation or a read operation at the moment that the reset switch is pressed by the user, the data stored in the storage device may be lost.

BRIEF SUMMARY OF THE INVENTION

In accordance with an embodiment, a storage device comprises a processor, a controller, and a switch. The processor is configured to control the operation of a logic circuit. When a main reset signal is enabled, the processor generates a sub-reset signal according to the operation of the logic circuit. The controller generates a mask signal according to the main reset signal and the sub-reset signal. When the mask signal is enabled, the switch does not transmit the main reset signal to the logic circuit. When the mask signal is not enabled, the switch transmits the main reset signal to the logic circuit to reset the logic circuit.

A reset method for resetting a logic circuit of a storage device is provided. An exemplary embodiment of a reset method is described in the following. A count value is adjusted according to a main reset signal. The logic circuit is deactivated after the logic circuit has finished a task which is being performed by the logic circuit. A determination is made as to whether the logic circuit has de-activated. The count value is reset and adjusted again when the logic circuit has not activated. A determination is made as to whether the count value is equal to a pre-determined value. The logic circuit is reset when the count value is equal to the pre-determined value.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Figure 1A:
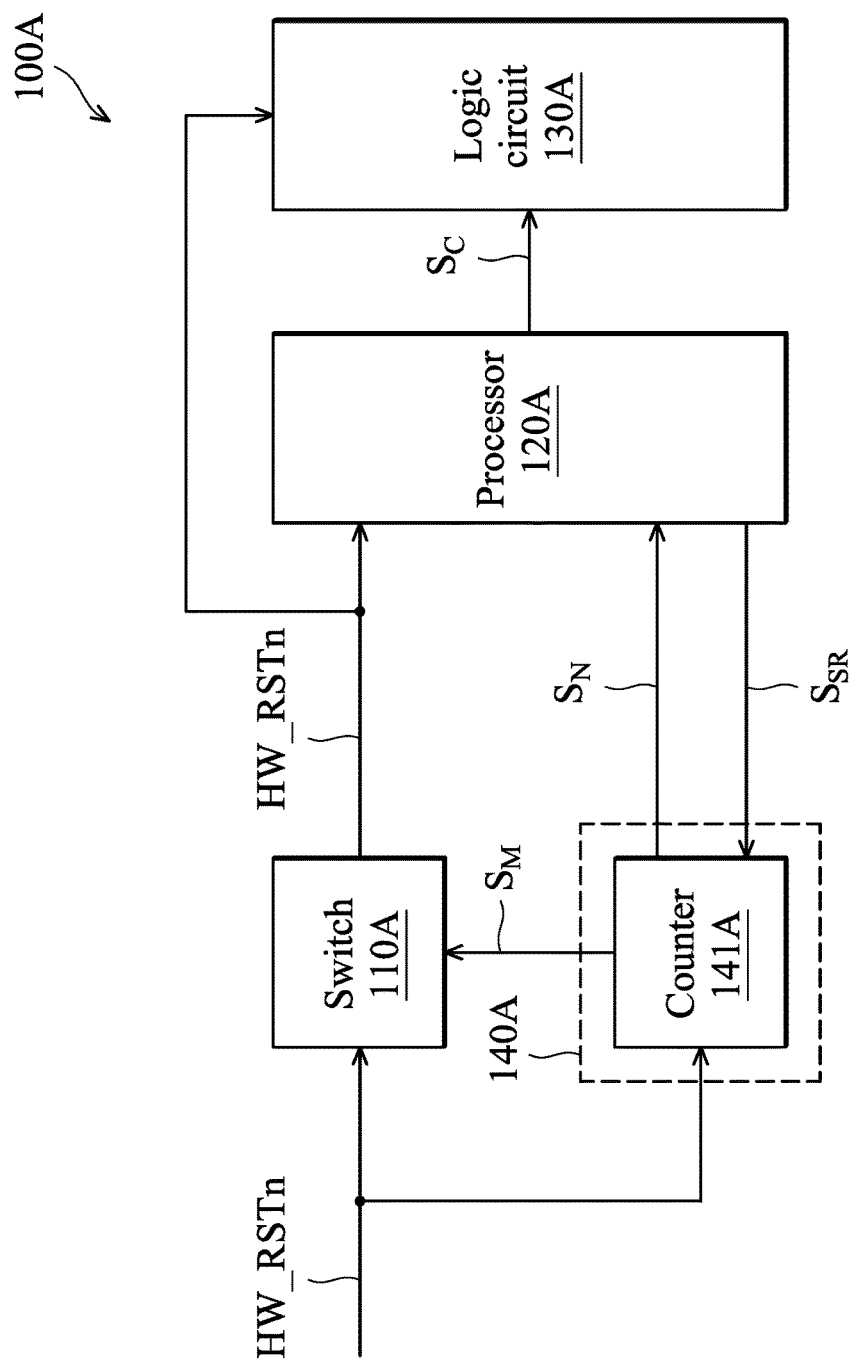
FIG. 1A is a schematic diagram of another exemplary embodiment of the storage device, in accordance with some embodiments.

FIG. 1A is a schematic diagram of an exemplary embodiment of a storage device, in accordance with some embodiments. The storage device 100A comprises a switch 110A, a processor 120A, a logic circuit 130A, and a controller 140A. The switch 110A determines whether to transmit a main reset signal HW_RSTn to the processor 120A and the logic circuit 130A according to a mask signal $S_M$. In one embodiment, when the mask signal $S_M$ is enabled, the switch 110A does not transmit the main reset signal HW_RSTn to the processor 120A and the logic circuit 130A. When the mask signal $S_M$ is not enabled, the switch 110A transmits the main reset signal HW_RSTn to the processor 120A and the logic circuit 130A.

In one embodiment, the switch 110A transmits the main reset signal HW_RSTn according to the voltage level of the mask signal $S_M$. For example, when the voltage level of the mask signal $S_M$ is high, it means that the mask signal $S_M$ is enabled. Therefore, the switch 110A does not transmit the main reset signal HW_RSTn. When the voltage level of the mask signal $S_M$ is low, it means that the mask signal $S_M$ is not enabled. Therefore, the switch 110A transmits the main reset signal HW_RSTn. In other embodiments, when the mask signal $S_M$ is at a low level, it means that the mask signal $S_M$ is enabled. Therefore, the switch 110A does not transmit the main reset signal HW_RSTn. When the mask signal $S_M$ is at a high level, it means that the mask signal $S_M$ is not enabled. Therefore, the switch 110A transmits the main reset signal HW_RSTn.

The processor 120A is configured to control the operation of the logic circuit 130A. In one embodiment, the processor 120A utilizes the logic circuit 130A to write external data to a memory (not shown). In one embodiment, the memory comprises a read only memory (ROM) and a random access memory (RAM). In another embodiment, the processor 120A utilizes the logic circuit 130A to read data stored in the memory and provides the data to an external device (not shown). In one embodiment, the external device is disposed outside of the storage device 100A independently.

In this embodiment, when the switch 110A outputs the main reset signal HW_RSTn and the main reset signal HW_RSTn is enabled, the processor 120A generates a sub-reset signal $S_{SR}$ according to the operation status of the logic circuit 130A. For example, when the main reset signal HW_RSTn is enabled, the processor 120A sends a control signal $S_C$ to control the logic circuit 130A to finish the present task which is being performed by the logic circuit 130A. The task may be a write operation or a read operation. After receiving the control signal $S_C$, the logic circuit 130A first finishes the task being performed and then stops operating.

In one embodiment, after sending the control signal $S_C$, at regular time intervals, the processor 120A detects whether the logic circuit 130A has stopped operating. When the logic circuit 130A has not stopped operating yet, the processor 120A enables the sub-reset signal $S_{SR}$. When the logic circuit 130A has stopped operating, the processor 120A does not enable the sub-reset signal $S_{SR}$. In one embodiment, when the sub-reset signal $S_{SR}$ is at a high level, it means that the sub-reset signal $S_{SR}$ is enabled. Conversely, when the sub-reset signal $S_{SR}$ is at a low level, it means that the sub-reset signal $S_{SR}$ is not enabled. In another embodiment, when the sub-reset signal $S_{SR}$ is at a low level, it means that the sub-reset signal $S_{SR}$ is enabled. When the sub-reset signal $S_{SR}$ at a high level, it means that the sub-reset signal $S_{SR}$ is not enabled.

In other embodiments, the sub-reset signal $S_{SR}$ is maintained at a fixed level, such as a high level or a low level. When the processor 120A enables the sub-reset signal $S_{SR}$, the voltage level of the sub-reset signal $S_{SR}$ is changed provisionally. Therefore, the sub-reset signal $S_{SR}$ has at least one positive pulse or at least one negative pulse. In this case, the number of pulses is equal to the number of the times which the sub-reset signal $S_{SR}$ is enabled by the processor 120A.

The invention does not limit how the processor 120A determines whether the main reset signal HW_RSTn is enabled. In this embodiment, the processor 120A determines whether the main reset signal HW_RSTn is enabled according to a notice signal $S_N$ generated by the controller 140A. In another embodiment, the processor 120A directly receives the main reset signal HW_RSTn to determine whether the main reset signal HW_RSTn is enabled.

In the present invention, the voltage level of the main reset signal HW_RSTn, which is enabled, is not limited. In one embodiment, when the main reset signal HW_RSTn is enabled, the main reset signal HW_RSTn is at a high level. When the main reset signal HW_RSTn is not enabled, the main reset signal HW_RSTn is at a low level. In another embodiment, when the main reset signal HW_RSTn is enabled, the main reset signal HW_RSTn is at the low level. When the main reset signal HW_RSTn is not enabled, the main reset signal HW_RSTn is at the high level. Additionally, when the main reset signal HW_RSTn is enabled, the voltage level of the main reset signal HW_RSTn is a first level. When the sub-reset signal $S_{SR}$ is enabled, the voltage level of the sub-reset signal $S_{SR}$ is a second level. In some embodiments, the first level may be equal to or unequal to the second level. Furthermore, assume that the voltage level of the mask signal $S_M$ is a third level mask signal $S_M$ when the mask signal $S_M$ is enabled. In other embodiments, the first level may be equal to or unequal to the third level.

The controller 140A generates the mask signal $S_M$ according to the main reset signal HW_RSTn and the sub-reset signal $S_{SR}$. For example, when the sub-reset signal $S_{SR}$ is enabled, it means that the logic circuit 130A is operating. Since some operations of the logic circuit 130A cannot be interrupted, if the logic circuit 130A is reset, some elements may break down. Therefore, when the main reset signal HW_RSTn is enabled, the controller 140A determines whether the sub-reset signal $S_{SR}$ is enabled. If the sub-reset signal $S_{SR}$ is enabled, the controller 140A enables the mask signal $S_M$ to turn off the switch 110A. Therefore, the switch 110A does not transmit the main reset signal HW_RSTn to the processor 120A and the logic circuit 130A.

However, when the sub-reset signal $S_{SR}$ is not enabled, it means that the logic circuit 130A has stopped. Therefore, the controller 140A does not enable the mask signal $S_M$ such that the switch 110A is turned on. At this time, the switch 110A transmits the main reset signal HW_RSTn to the processor 120A and the logic circuit 130A. The processor 120A and the logic circuit 130A are reset according to the main reset signal HW_RSTn. In one embodiment, the processor 120A comprises a logical reset root. The logical reset root resets the processor 120A and the logic circuit 130A.

The invention does not limit the internal structure of the controller 140A. In one embodiment, the controller 140A is a counter 141A. The counter 141A may be an up counter or a down counter. When the main reset signal HW_RSTn is enabled, if the sub-reset signal $S_{SR}$ is not enabled, the counter 141A gradually adjusts a count value. However, if the sub-reset signal $S_{SR}$ is enabled, it means that the logic circuit 130A has not stopped yet. Therefore, the count value of the counter 141A is reset to an initial value. A determination can be made as to whether the logic circuit 130A has stopped according to the count value of the counter 141A.

When the count value of the counter 141A is not equal to a pre-determined value, it means that the logic circuit 130A has not stopped. Therefore, the counter 141A enables the mask signal $S_M$ to turn off the switch 110A. At this time, the switch 110A does not transmit the main reset signal HW_RSTn to the processor 120A and the logic circuit 130A. However, when the count value of the counter 141A is equal to the pre-determined value, it means that the logic circuit 130A has stopped completely. Therefore, the counter 141A does not enable the mask signal $S_M$ to turn on the switch 110A. At this time, the switch 110A transmits the main reset signal HW_RSTn to the processor 120A and the logic circuit 130A. When the processor 120A and the logic circuit 130A receives the main reset signal HW_RSTn, each of the processor 120A and the logic circuit 130A performs a reset operation to initialize the registers of the processor 120A and the logic circuit 130A.

The invention does not limit how the counter 141A adjusts the count value. For example, when the counter 141A is an up-counter, the counter 141A gradually increases the count value. When the counter 141A is a down-counter, the counter 141A gradually decreased the count value.

Figure 1B:
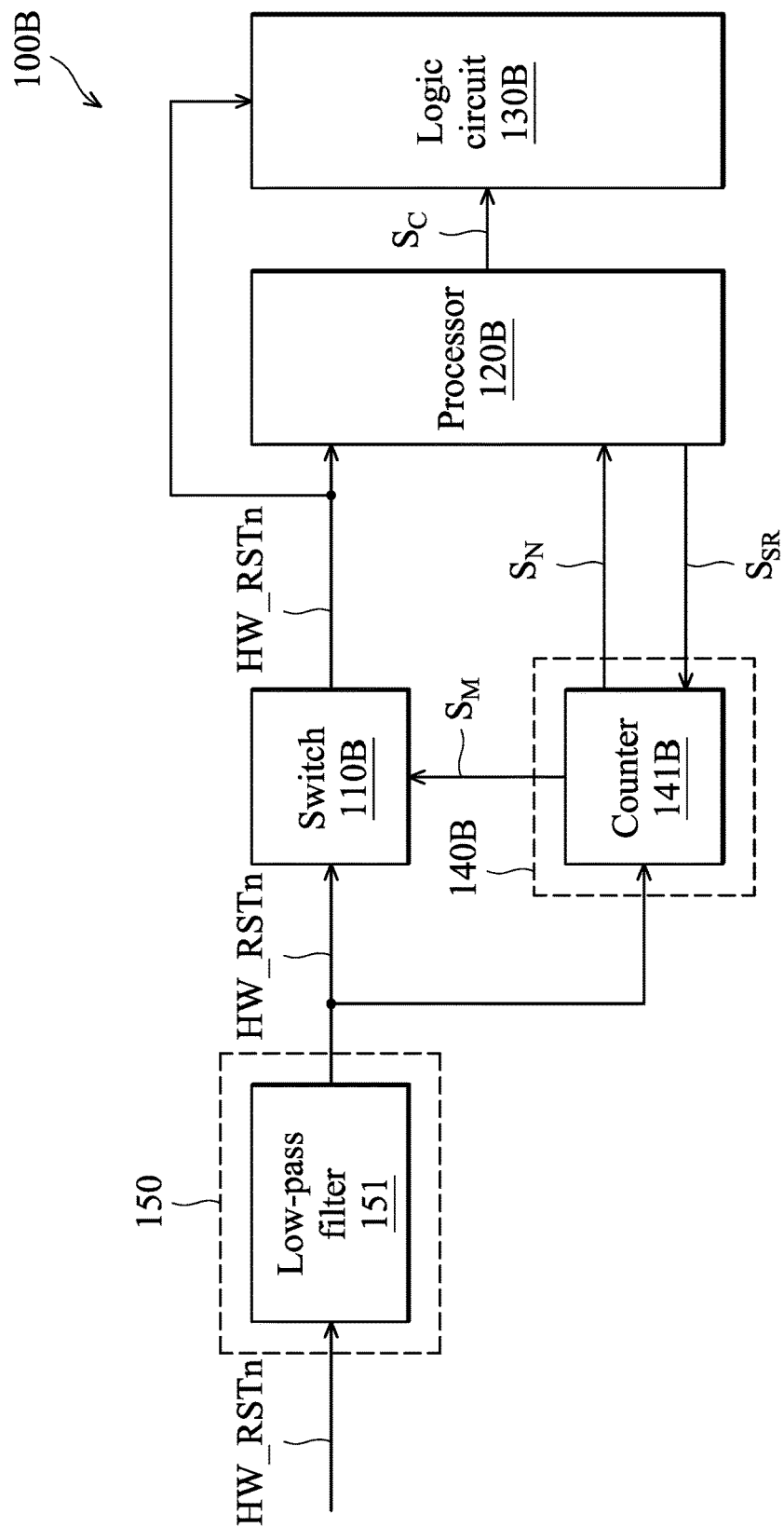
FIG. 1B is a schematic diagram of another exemplary embodiment of the storage device, in accordance with some embodiments.

FIG. 1B is a schematic diagram of another exemplary embodiment of the storage device, in accordance with some embodiments. FIG. 1B is similar to FIG. 1A except for the addition of a detector 150. The detector 150 receives the main reset signal HW_RSTn to determine whether the duration of the main reset signal HW_RSTn being enabled is less than a pre-determined time. For example, when the duration of the main reset signal HW_RSTn being enabled is less than the pre-determined time, it means that noise may be interfering with the main reset signal HW_RSTn. Therefore, the detector 150 does not output the main reset signal HW_RSTn to the switch 110B and the controller 140B. At this time, the switch 110B and the controller 140B do not operate provisionally.

However, when the duration of the main reset signal HW_RSTn being enabled is not less than the pre-determined time, the detector 150 outputs the main reset signal HW_RSTn to the switch 110B and the controller 140B. At this time, the controller 140B determines whether to turn on the switch 110B according to the sub-reset signal $S_{SR}$ generated by the processor 120B. Since the operations of the switch 110B, the controller 140B, the processor 120B, and the logic circuit 130B are the same as the operations of the switch 110A, the controller 140A, the processor 120A, and the logic circuit 130A, the descriptions of the operations of the switch 110B, the controller 140B, the processor 120B, and the logic circuit 130B are omitted for brevity. In the present invention, the circuit structure of the detector 150 is not limited. Any circuit can serve as the detector 150, as long as the circuit is capable of detecting the duration of the main reset signal HW_RSTn being enabled. In one embodiment, the detector 150 is a low-pass filter 151.

Figure 2:
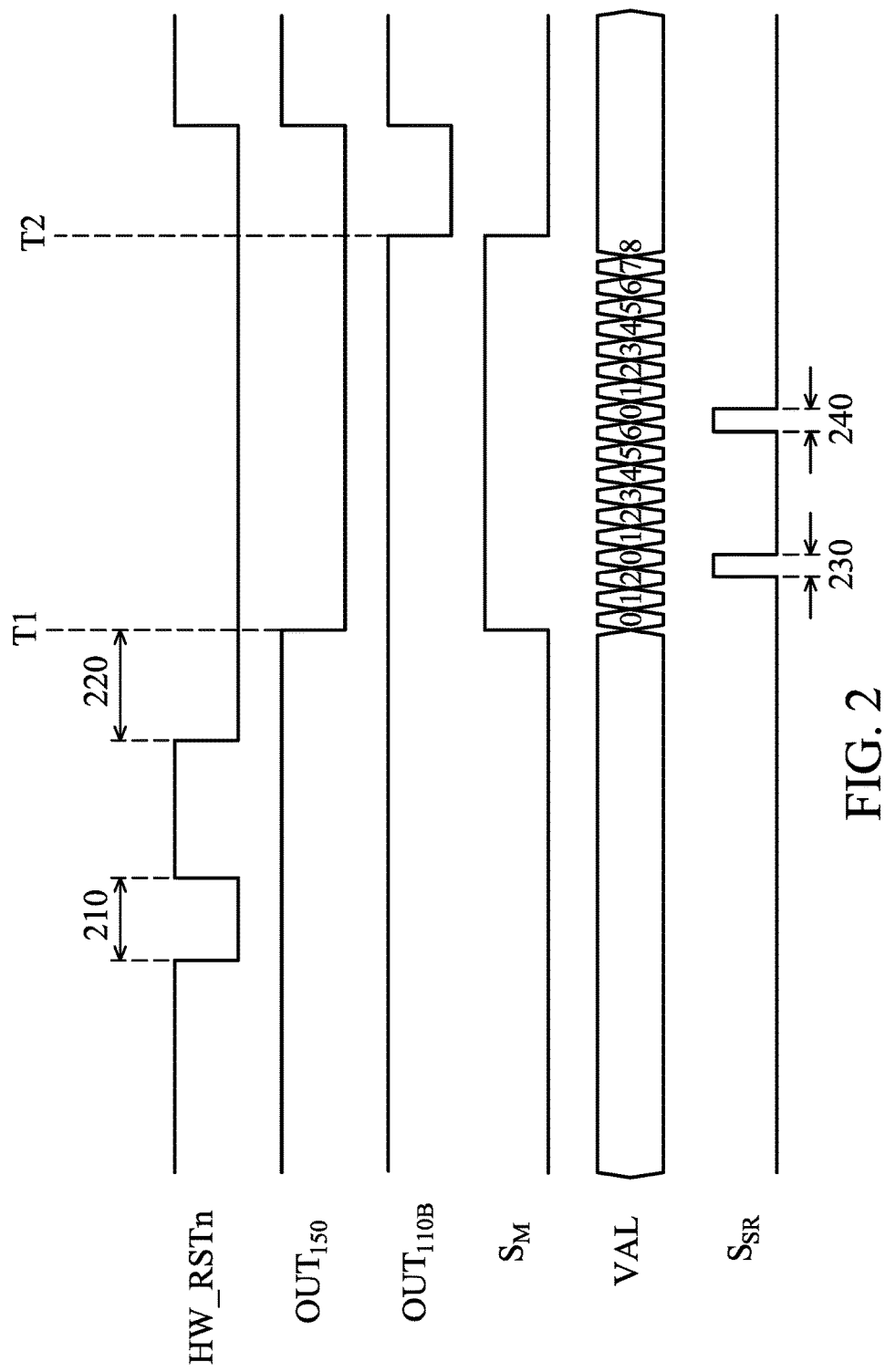
FIG. 2 is a timing diagram of the storage device, in accordance with an embodiment of the invention.

FIG. 2 is a timing diagram of the storage device shown in FIG. 1B, in accordance with an embodiment of the invention. The symbol $OUT_{150}$ represents the output signal of the detector 150. The symbol $OUT_{110B}$ represents the output signal of the switch 110B. The symbol VAL represents the count value of the counter 141A. For brevity, assume that the counter 141B is an up-counter.

During period 210, the main reset signal HW_RSTn is at a low level. It means that the main reset signal HW_RSTn is enabled. However, since the duration of the main reset signal HW_RSTn being enabled is less than a pre-determined time, the detector 150 does not output the main reset signal HW_RSTn. In this embodiment, the output signal of the detector 150 is maintained at a high level, but the disclosure is not limited thereto. In other embodiments, if the main reset signal HW_RSTn is enabled and at the high level, when the duration of the main reset signal HW_RSTn being enabled is less than the pre-determined time, the output signal of the detector 150 is maintained at a low level. Additionally, when the main reset signal HW_RSTn is not enabled, the output signal of the detector 150 is maintained at the low level.

During period 220, the main reset signal HW_RSTn is at the low level, which means that the main reset signal HW_RSTn is enabled. When the duration of the main reset signal HW_RSTn being enabled equals the pre-determined time, the detector 150 outputs the main reset signal HW_RSTn at time point T1. As shown in FIG. 2, the output signal of the detector 150 is changed from the high level to the low level at time point T1. At this time, since the detector 150 outputs the main reset signal HW_RSTn and the main reset signal HW_RSTn is enabled, the counter 141B starts counting. In this embodiment, the count value of the counter 141B is gradually increased from 0. Since the count value of the counter 141B does not equal a pre-determined value (e.g. 8), the counter 141B enables the mask signal $S_M$ at time point T1 such that the mask signal $S_M$ is at the high level. Since the mask signal $S_M$ is enabled, the switch 110B does not transmit the main reset signal HW_RSTn.

During periods 230 and 240, the processor 120B determines whether the logic circuit 130B has stopped operating. Since the logic circuit 130B has not stopped operating, the processor 120B enables the sub-reset signal $S_{SR}$. In this embodiment, the sub-reset signal $S_{SR}$ is maintained at the low level. When the processor 120B enables the sub-reset signal $S_{SR}$, the sub-reset signal $S_{SR}$ has a positive pulse. Since the processor 120B enables the sub-reset signal $S_{SR}$ twice, the sub-reset signal $S_{SR}$ has two positive pulses. When the sub-reset signal $S_{SR}$ has a positive pulse, the count value of the counter 141B is reset to 0 and the count value is increased again.

At time point T2, since the count value of the counter 141B is equal to the pre-determined value, the counter 141B does not enable the mask signal $S_M$. Therefore, the level of the mask signal $S_M$ is changed from the high level to the low level. Since the mask signal $S_M$ is not enabled, the switch 110B transmits the main reset signal HW_RSTn to the processor 120B and the logic circuit 130B. Each of the processor 120B and the logic circuit 130B performs a reset operation according to the main reset signal HW_RSTn.

Figure 3:
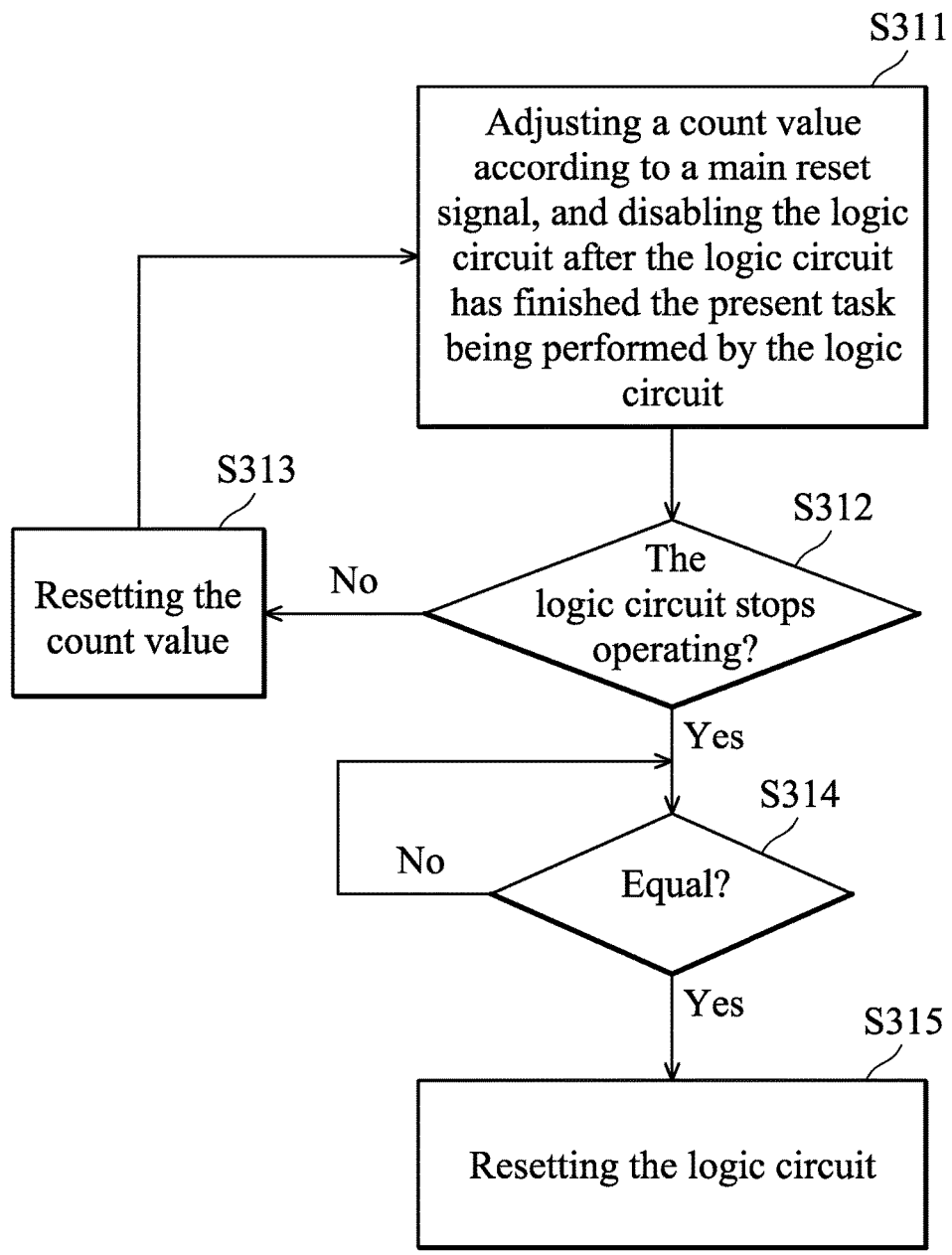
FIG. 3 is a flowchart of an exemplary embodiment of a reset method, in accordance with some embodiments.

FIG. 3 is a flowchart of an exemplary embodiment of a reset method, in accordance with some embodiments. The reset method is applied to a storage device to reset the logic circuit of the storage device. First, a count value is adjusted according to a main reset signal, and the logic circuit is disabled after the logic circuit has finished the present task being performed by the logic circuit (step S311). In one embodiment, a counter is utilized to adjust the count value. In this case, when the main reset signal is enabled, the counter starts increasing or decreasing a count value. However, when the main reset signal is not enabled, the counter does not adjust the count value.

In another embodiment, when the main reset signal is enabled and the duration of the main reset signal being enabled is shorter than a pre-determined time, it means that noise may be interfering with the main reset signal. Therefore, the counter stops adjusting the count value. However, when the duration of the main reset signal being enabled is not less than the pre-determined time, the counter increases the count value.

Next, a determination is made as to whether the logic circuit has stopped (step S312). When the logic circuit has not stopped yet, the count value is reset (step S313) and step S311 is executed to adjust the count value again. When the logic circuit has stopped, a determination is made as to whether the count value is equal to a pre-determined value (step S314). When the count value is equal to the pre-determined value, it means that the logic circuit has stopped. Therefore, the logic circuit is reset (step S315). In one embodiment, step S315 is to initialize the data stored in the internal registers of the logic circuit.

When the main reset signal is enabled, it starts adjusting the count value. However, when the logic circuit is operating, the count value is reset and initialed to an initial value until the logic circuit has stopped. When the logic circuit has stopped, the count value is not reset. When the count value is not reset, the count value is gradually close to a pre-determined value. When the count value is equal to the pre-determined value, the main reset signal is send to the logic circuit to reset the logic circuit. At this time, since the logic circuit has stopped, a breakdown does not occur in the elements (e.g. NAND flash) of the logic circuit.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A storage device, comprising:
   a processor configured to control an operation of a logic circuit, wherein when a main reset signal is enabled, the processor generates a sub-reset signal according to the operation of the logic circuit;
   a controller generating a mask signal according to the main reset signal and the sub-reset signal; and
   a switch, wherein when the mask signal is enabled, the switch does not transmit the main reset signal to the logic circuit, and when the mask signal is not enabled, the switch transmits the main reset signal to the logic circuit to reset the logic circuit, wherein the controller is a counter, and wherein when the main reset signal is enabled, the counter gradually increases a count value, when the logic circuit does not stop operating, the processor resets the count value, and when the logic circuit stops operating, the processor does not reset the count value.

2. The storage device as claimed in claim 1, wherein the processor directly receives the main reset signal.

3. The storage device as claimed in claim 1, wherein when the main reset signal is enabled, the controller activates the processor to generate the sub-reset signal according to the operation of the logic circuit.

4. The storage device as claimed in claim 1, wherein when the main reset signal is enabled, the processor activates the logic circuit such that the logic circuit finishes a task and then stops operating, the processor determines whether the logic circuit has stopped, and when the logic circuit does not stop operating, the processor enables the sub-reset signal, wherein the task refers to a task being executed by the logic circuit.

5. The storage device as claimed in claim 4, wherein when the sub-reset signal is enabled, the controller enables the mask signal, and when the sub-reset signal is not enabled, the controller does not enable the mask signal.

6. The storage device as claimed in claim 1, wherein when the count value is not equal to a pre-determined value, the controller enables the mask signal, and when the count value is equal to the pre-determined value, the controller does not enable the mask signal.

7. The storage device as claimed in claim 1, further comprising:

a low-pass filter determining a duration of the main reset signal being enabled, wherein when the duration of the main reset signal being enabled is shorter than a pre-determined time, the low-pass filter does not provide the main reset signal to the switch, and when the duration of the main reset signal being enabled is equal to the pre-determined time, the low-pass filter provides the main reset signal to the switch.

8. A reset method for resetting a logic circuit of a storage device, comprising:

adjusting a count value according to a main reset signal and stopping an operation of the logic circuit after the logic circuit has finished a task which is being performed by the logic circuit;

determining whether the logic circuit stops operating;

resetting the count value and adjusting the count value again when the logic circuit does not stop operating;

determining whether the count value is equal to a pre-determined value; and resetting the logic circuit when the count value is equal to the pre-determined value.

9. The reset method as claimed in claim 8, wherein the step of adjusting the count value according to the main reset signal and controlling the logic circuit to stop operating comprises:

determining a duration of the main reset signal being enabled;

increasing the count value when the duration of the main reset signal being enabled is not shorter than a pre-determined time; and stopping increasing the count value when the duration of the main reset signal being enabled is shorter than the pre-determined time.

* * * * *